US011942175B2

(12) United States Patent
Amato et al.

(10) Patent No.: US 11,942,175 B2
(45) Date of Patent: Mar. 26, 2024

(54) MEMORY DEVICE PROTECTION USING INTERLEAVED MULTIBIT SYMBOLS

(71) Applicant: Micron Technology, Inc., Boise, ID (US)

(72) Inventors: Paolo Amato, Treviglio (IT); Marco Sforzin, Cernusco Sul Naviglio (IT); Stephen S. Pawlowski, Beaverton, OR (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 17/874,897

(22) Filed: Jul. 27, 2022

(65) Prior Publication Data

US 2022/0359034 A1 Nov. 10, 2022

Related U.S. Application Data

(63) Continuation of application No. 17/124,197, filed on Dec. 16, 2020, now Pat. No. 11,404,136.

(51) Int. Cl.
*G11C 29/42* (2006.01)
*G11C 7/10* (2006.01)
*G11C 29/10* (2006.01)
*G11C 29/44* (2006.01)
*H03M 13/27* (2006.01)

(52) U.S. Cl.
CPC ............ *G11C 29/42* (2013.01); *G11C 7/1042* (2013.01); *G11C 29/10* (2013.01); *G11C 29/44* (2013.01); *H03M 13/27* (2013.01)

(58) Field of Classification Search
CPC .... H03M 13/2906; G11C 29/42; G11C 29/44; G11C 29/52; G06F 11/1044; G06F 11/1048; G06F 11/1068; G06F 11/1004
See application file for complete search history.

(56) References Cited

U.S. PATENT DOCUMENTS

| | | |
|---|---|---|
| 6,493,843 B1 | 12/2002 | Raynham |
| 7,096,407 B2 | 8/2006 | Olarig |
| 7,363,419 B2* | 4/2008 | Cronin ................ G06F 13/4256 711/167 |
| 7,484,161 B2 | 1/2009 | Dell et al. |
| 9,183,078 B1 | 11/2015 | Zhu et al. |
| 9,710,324 B2 | 7/2017 | Trombley |
| 10,236,917 B2 | 3/2019 | Vaidhyanathan et al. |
| 2010/0174955 A1* | 7/2010 | Carnevale .............. G11C 29/16 714/E11.169 |

(Continued)

FOREIGN PATENT DOCUMENTS

KR 20170109568 9/2017

OTHER PUBLICATIONS

International Search Report and Written Opinion from related PCT Application PCT/US2021/061353, dated Apr. 1, 2022, 10 pages.

*Primary Examiner* — Shelly A Chase
(74) *Attorney, Agent, or Firm* — Brooks, Cameron & Huebsch, PLLC

(57) ABSTRACT

Symbols interleaved among a set of codewords can provide an error correction/detection capability to a dual in-line memory module (DIMM) with memory chips having a comparatively larger bus width. Data corresponding to a set of multibit symbols and received from one or more memory devices can be interleaved/distributed with other bits of at least one codeword.

19 Claims, 9 Drawing Sheets

(56) References Cited

U.S. PATENT DOCUMENTS

| | | |
|---|---|---|
| 2014/0143633 A1 | 5/2014 | Campbell et al. |
| 2015/0309873 A1 | 10/2015 | Yoon et al. |
| 2016/0070616 A1* | 3/2016 | Tavallaei ................ G06F 3/064 |
| | | 714/766 |
| 2016/0269147 A1 | 9/2016 | Liikanen et al. |
| 2019/0102246 A1* | 4/2019 | Criss ................... G06F 11/1044 |
| 2019/0391874 A1* | 12/2019 | Lien .................... G06F 11/1048 |
| 2020/0201709 A1 | 6/2020 | Song et al. |
| 2020/0210286 A1 | 7/2020 | Kumar et al. |

* cited by examiner

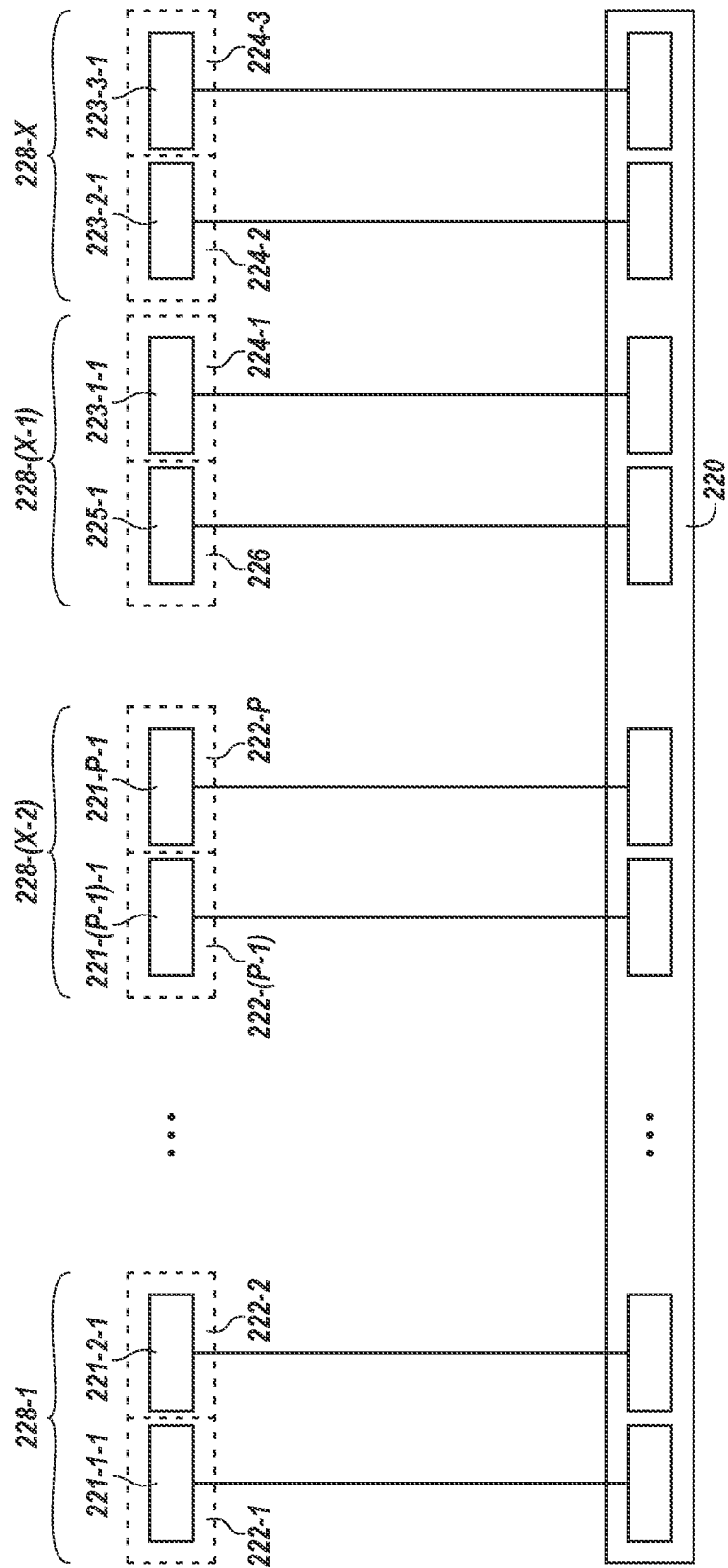

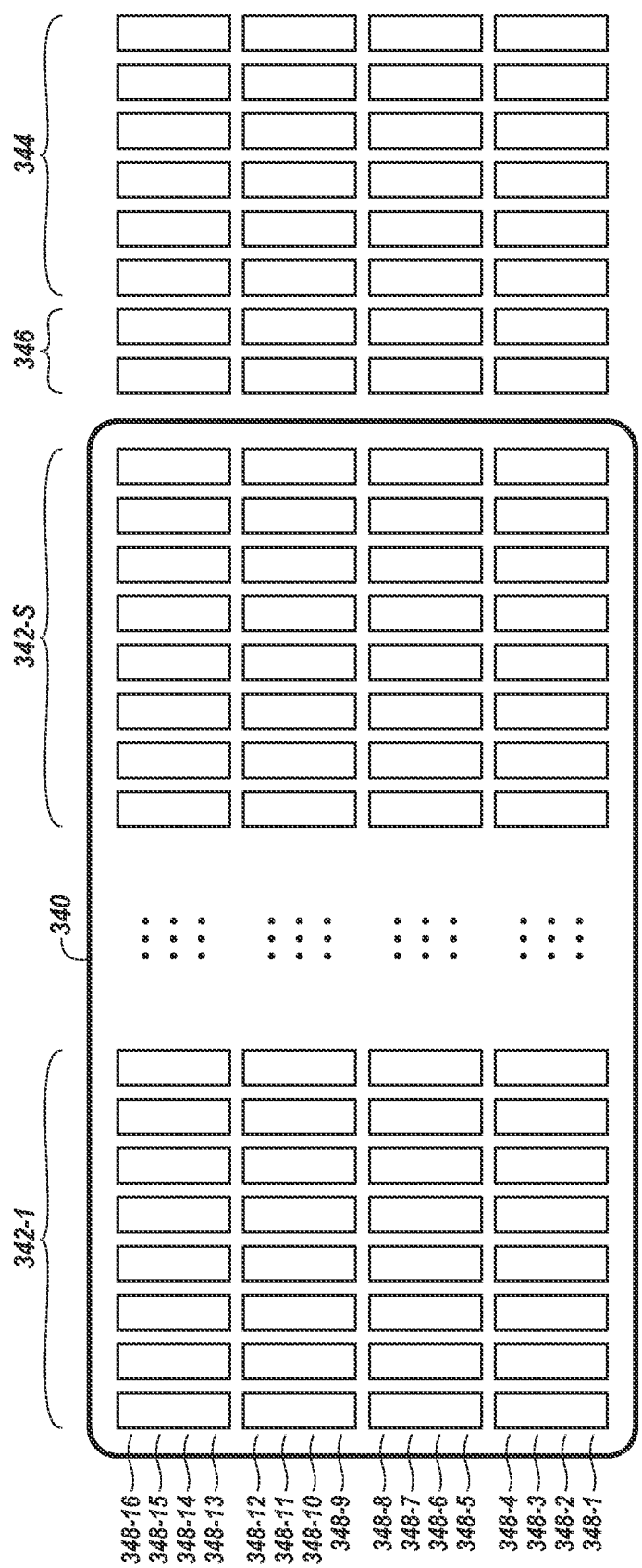

MEMORY DEVICE PROTECTION USING INTERLEAVED MULTIBIT SYMBOLS

PRIORITY INFORMATION

This application is a Continuation of U.S. application Ser. No. 17/124,197, filed Dec. 16, 2020, the contents of which are included herein by reference.

TECHNICAL FIELD

The present disclosure relates generally to memory, and more particularly to apparatuses, systems, and methods associated with memory device protection using interleaved multibit symbols

BACKGROUND

Memory devices are typically provided as internal, semiconductor, integrated circuits in computers or other electronic devices. There are many different types of memory including volatile and non-volatile memory. Volatile memory can require power to maintain its data and includes random-access memory (RAM), dynamic random access memory (DRAM), and synchronous dynamic random access memory (SDRAM), among others. Non-volatile memory can provide persistent data by retaining stored data when not powered and can include NAND flash memory, NOR flash memory, read only memory (ROM), Electrically Erasable Programmable ROM (EEPROM), Erasable Programmable ROM (EPROM), and resistance variable memory such as phase change random access memory (PCRAM), resistive random access memory (RRAM), ferroelectric random access memory (FeRAM), and magnetoresistive random access memory (MRAM), among others.

Memory is also utilized as volatile and non-volatile data storage for a wide range of electronic applications. including, but not limited to personal computers, portable memory sticks, digital cameras, cellular telephones, portable music players such as MP3 players, movie players, and other electronic devices. Memory cells can be arranged into arrays, with the arrays being used in memory devices.

Memory can be part of a memory module (e.g., a dual in-line memory module (DIMM)) used in computing devices. Memory modules can include volatile memory, such as DRAM, for example, and/or non-volatile memory, such as FeRAM or RRAM, for example. DIMMs can serve as main memory in computing systems, for example.

BRIEF DESCRIPTION OF THE DRAWINGS

FIGS. 2A-2D illustrate a number of codewords with symbols interleaved among those in accordance with a number of embodiments of the present disclosure.

FIGS. 3A-3B illustrates a memory transfer block with subsets of data received from a number of memory devices/cache in accordance with a number of embodiments of the present disclosure.

DETAILED DESCRIPTION

Figure 1A:
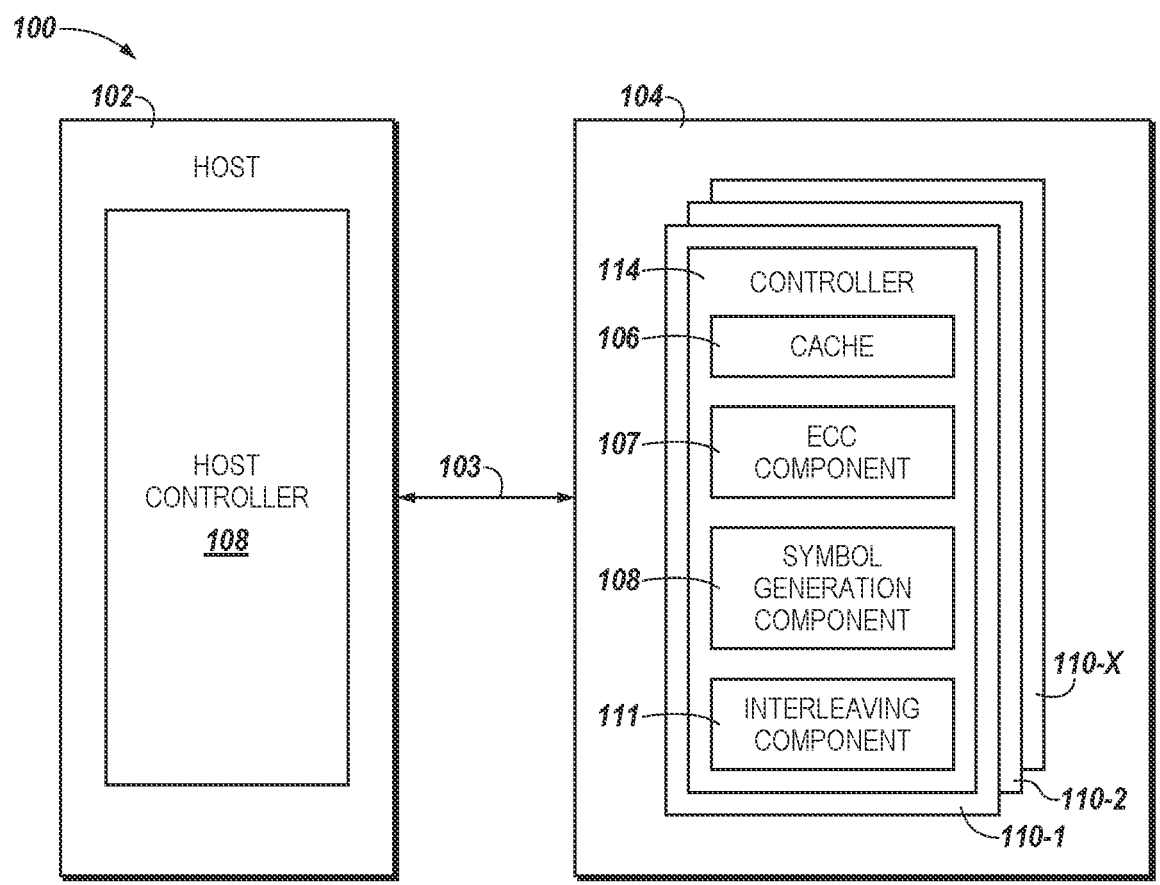
FIG. 1A is a block diagram of an apparatus in the form of a portion of a computing system including a host and a memory system in accordance with a number of embodiments of the present disclosure.

The present disclosure includes apparatuses and methods related to memory device protection using interleaved multibit symbols. In various embodiments, the protection scheme can be referred to as a "chipkill" and can be used to detect and/or correct errors across multiple memory devices (e.g., chips) such as on a memory module (e.g., DIMM). Chipkill protection can be used, for instance, as an advanced RAS (Reliability, Availability, and Serviceability) feature that can allow a memory module to work properly even if a constituent chip is complete damaged (e.g., non-functional). Due to increasing demands for larger capacity and higher bandwidth DIMMs, it can be desirable to provide memory devices (e.g., chips) having a wider bus width.

As an example, some previous chipkill schemes applied to DIMMs with chips comprising a 4-bit wide bus (referred to as ×4 DIMM) and/or 8-bit memory chip (referred to as ×8 DIMM) may not provide an adequate level of protection (e.g., against errors) and/or performance efficiency (e.g., reduced latency) when the same is operated in a DIMM comprising ×16 chips (e.g., chips having a 16-bit wide data bus) Rather, the chipkill operating on the ×4 DIMM and/or ×8 DIMM may result increased latency and/or a decreased level of protection against errors, when implemented in the ×16 DIMM. As used herein, a "n-bit memory chip" or "n-bit memory device" refers to a memory chip/device having a n-bit bus width that is capable of providing n bits at a time (e.g., per data burst).

A number of embodiments of the present disclosure provides an error correction/detection capability for various memory device types and protocols including, but not limited to, low-power double data rate 5 (LPDDR5) DRAM devices and/or FeRAM device, for example. The error correction/detection schemes in accordance with embodiments of the present disclosure can provide benefits such as reduced latencies associated with error-correcting/detecting and/or a greater level of protection against errors as compared to previous chipkill techniques.

In the following detailed description of the present disclosure, reference is made to the accompanying drawings that form a part hereof, and in which is shown by way of illustration how one or more embodiments of the disclosure may be practiced. These embodiments are described in sufficient detail to enable those of ordinary skill in the art to practice the embodiments of this disclosure, and it is to be understood that other embodiments may be utilized and that process, electrical, and structural changes may be made without departing from the scope of the present disclosure.

As used herein, designators such as "N" and "M," etc., particularly with respect to reference numerals in the drawings, indicate that a number of the particular feature so designated can be included. It is also to be understood that the terminology used herein is for the purpose of describing particular embodiments only, and is not intended to be limiting. As used herein, the singular forms "a," "an," and "the" can include both singular and plural referents, unless the context clearly dictates otherwise. In addition, "a number of," "at least one," and "one or more" (e.g., a number of memory banks) can refer to one or more memory banks, whereas a "plurality of" is intended to refer to more than one of such things.

Furthermore, the words "can" and "may" are used throughout this application in a permissive sense (i.e., having the potential to, being able to), not in a mandatory sense (i.e., must). The term "include," and derivations thereof, means "including, but not limited to." The terms "coupled" and "coupling" mean to be directly or indirectly connected physically or for access to and movement (transmission) of commands and/or data, as appropriate to the context.

The figures herein follow a numbering convention in which the first digit or digits correspond to the figure number and the remaining digits identify an element or component in the figure. Similar elements or components between different figures may be identified by the use of similar digits. For example, 101 may reference element "01" in FIG. 1, and a similar element may be referenced as 201 in FIG. 2. A group or plurality of similar elements or components may generally be referred to herein with a single element number. For example, a plurality of reference elements 105-1, ..., 105-Z or 105-1 to 105-Z, for simplicity, may be referred to generally as 105. As will be appreciated, elements shown in the various embodiments herein can be added, exchanged, and/or eliminated so as to provide a number of additional embodiments of the present disclosure. In addition, the proportion and/or the relative scale of the elements provided in the figures are intended to illustrate certain embodiments of the present disclosure and should not be taken in a limiting sense.

FIG. 1A is a functional block diagram of a computing system 100 including an apparatus in the form of a memory system 104, in accordance with one or more embodiments of the present disclosure. As used herein, an "apparatus" can refer to, but is not limited to, any of a variety of structures or combinations of structures, such as a circuit or circuitry, a die or dice, a module or modules, a device or devices, or a system or systems, for example.

As illustrated in FIG. 1A, the computing system 100 can include a host 102 and memory system 104. In a number of embodiments, the memory system 104 can be coupled to host 102 via a channel 103. The host 102 can be a laptop computer, personal computers, digital camera, digital recording and playback device, mobile telephone, PDA, memory card reader, interface hub, among other host systems, and can include a memory access device, e.g., a processor. One of ordinary skill in the art will appreciate that "a processor" can intend one or more processors, such as a parallel processing system, a number of coprocessors, etc.

The host 102 can send commands to the memory system 104 via the channel 103 to read, write, and erase data, among other operations. A physical host interface can provide an interface for passing control, address, data, and other signals between the memory system 104 and host 102 having compatible receptors for the physical host interface. The signals can be communicated between 102 and memory system 104 on a number of buses, such as a data bus and/or an address bus, for example, via the channel 103.

The memory system 104 can include dual in-line memory modules (DIMM) 110-1, ..., 110-X as illustrated in FIG. 1A, for example. The DIMMs 110-1, ..., 110-X can include various types of memory. As an example, The DIMMs 110, ..., 110-X can include volatile memory such as DRAM (e.g., DRAM dies) and/or FeRAM, and/or non-volatile memory such as NAND flash memory and/or three-dimensional cross-point ("3D cross-point"), or any combination thereof. As used herein, a DIMM including DRAM is referred to as a DRAM DIMM, a DIMM including FeRAM is referred to as a FeRAM DIMM, and a DIMM including non-volatile memory, such as NAND flash memory and/or 3D cross-point is referred to as a non-volatile DIMM (NVDIMM). Embodiments are not limited to a particular type of memory a DIMM can include. For example, the DIMM can also include RAM, ROM, SDRAM, PCRAM, and/or RRAM, among others.

The DIMMs 110-1, ..., 110-X can be operated according to various types of protocols depending on the type of memory in the DIMMs 110-1, ..., 110-X. As an example, a DRAM DIMM (of the DIMMs 110-1, ..., 110-X) can be operated according to a double data rate (DDR) protocol including DDR1 to 5 and/or Low-Power DDR (LPDDR) 1 to 5 as defined by the joint electron device engineering council (JEDEC). As an example, a DIMM can be a LPDDR5-compliant DIMM (LPDDR5 DIMM).

The embodiment of FIG. 1A can include additional circuitry that is not illustrated so as not to obscure embodiments of the present disclosure. For example, the memory system 104 can include address circuitry to latch address signals provided over I/O connections through I/O circuitry. Address signals can be received and decoded by a row decoder and a column decoder to access the DIMMs 110-1, ..., 110-X. It will be appreciated by those skilled in the art that the number of address input connections can depend on the density and architecture of the DIMMs 110-1, ..., 110-X.

As illustrated in FIG. 1A, the DIMMs 110-1, ..., 110-X includes respective controllers, such as a controller 114. The controller 114 on the DIMMs 110-1, ..., 110-X can include control circuitry, e.g., hardware, firmware, and/or software. In one or more embodiments, the controller 114 can be an application specific integrated circuit (ASIC) and/or a field programmable gate array (FPGA) coupled to a printed circuit board including a physical interface.

As illustrated in FIG. 1A, the controller 114 can include a cache 106, an error correction code (ECC) component 107, symbol generation component 108, and an interleaving component 111. The components 106, 107, 108, and/or 111 are not limited to circuitry (e.g., hardware), but can be implemented in hardware, firmware, of software, or any combination thereof.

In a number of embodiments, the ECC component 107 can be configured to use the symbol generation component 108 to generate N-bit symbols (e.g., non-ECC N-bit symbols) based on data received from the host 102. Symbols that can be generated using the symbols generation component 108 can be a multibit symbol, such as a non-binary symbol. For example, non-binary symbol(s) having N bits can be one of $2^N$ elements of a finite Galois field. As used herein, a multibit symbol and a non-binary symbol are used interchangeably here and can have the same meaning, as appropriate to the context.

In some embodiments, memory cells can be binary and configured, to store q=2 states. In this example, a symbol of N cells is an element of the Galois filed with $2^N$ elements. In some embodiments, memory cells can be non-binary. For example, the memory cell can be configured to store q=3 stable states. In this example, a symbol of N cells can be an element of the Galois field with $3^N$ elements. An amount of information (e.g., bits) contained in q-states cell can be $\log_2 q$ such that N cells includes $N \log_2 q$ bits. For example, the amount of information contained in a 3-state cell is $\log_2 3 \approx 1.58$ bit, while the amount of information contained in N cells of 3-state is $N \log_2 3 \approx 1.58 \times N$. This indicates that, to represent a symbol of N memory cells with each memory cell having q states, at least $\lceil N \log_2 q \rceil$ bits is needed.

The ECC component 107 can be used by the controller 114 to generate ECC data/symbol(s) based on data received from the host 102 and/or symbol generation component 108. The ECC component 107 can be operated based on various types of ECC codes, such as Hamming codes, Reed-Solomon (RS) codes, Bose-Chaudhuri-Hochquenghem (BCH) codes, circular redundancy check (CRC) codes, Golay codes, Reed-Muller codes, Goppa codes, and Denniston codes, among others. As a non-limiting example, the ECC component 107 can be operated based on Hamming code and generate parity symbols (as ECC symbols) based on symbols generated at the symbol generation component 108.

Figure 1B:
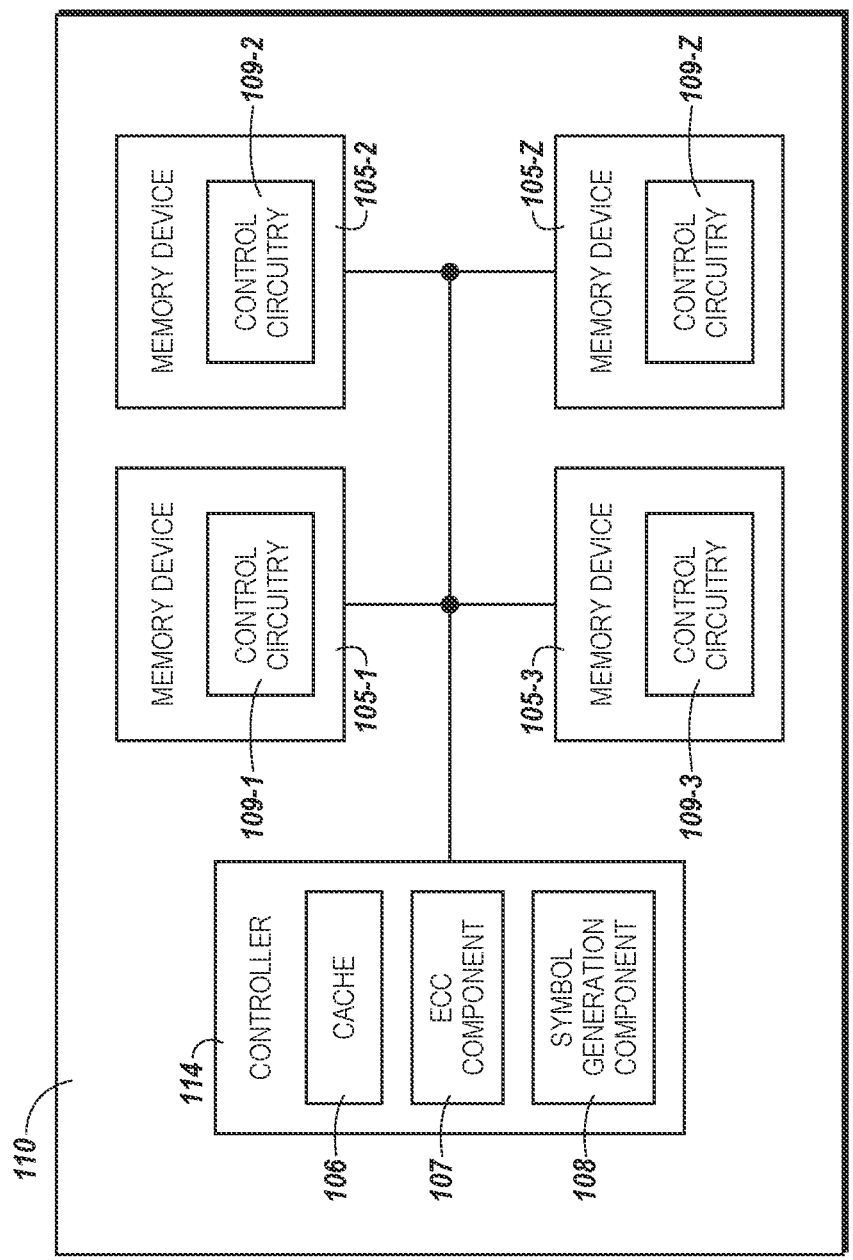
FIG. 1B is a block diagram of a non-volatile DIMM (NVDIMM) of a memory apparatus in accordance with a number of embodiments of the present disclosure.

The ECC component 107 can be also operated as an encoder/decoder for the controller 114. As an example, the ECC component 107 can encode data/symbols received from the host 102 and/or symbol generation component 108 as one or more codewords. Once codewords are generated, the ECC component 107 can write the codewords to various locations, such as memory devices 105-1, ..., 105-Z as illustrated in FIG. 1B. When the codewords are read from the locations, the ECC component 107 can perform an ECC operation on the codewords using, for example, the ECC data/symbols within the codewords to decode the codewords.

An ECC operation performed by the ECC component 107 can correct and/or detect error(s) of data read from memory devices (e.g., the memory devices 105-1, ..., 105-Z illustrated in FIG. 1B). The ECC operation can provide various types of error correction/detection capability such as a single error correction/double error detection (SEC-DEC), which can correct a single bit/symbol error in a codeword or detect two-bit/symbol errors in the codeword (without correcting the errors). As another non-limiting example, an ECC operation performed based on Hamming code can further include correcting up to three bits/symbol errors and/or detecting up to four bits/symbol errors. Further details of correcting/detecting error(s) within codewords are described in connection with FIGS. 2-3.

The controller 114 can be configured to use the interleaving component 111 to write encoded codeword(s) to a number of different memory locations (e.g., memory devices 105-1, ..., 105-Z illustrated in FIG. 1B) in a manner that portions of data (e.g., symbols) encoded within a same codeword are interleaved (e.g., distributed) among the different memory locations and/or portions (e.g., subsets) of data that are read from a same memory location are interleaved (e.g., distributed) among a number of different codewords. As an example, subsets of data (e.g., corresponding to symbols, respectively) simultaneously read from multiple memory devices (e.g., memory devices 105-1, ..., 105-Z illustrated in FIG. 1B) in a same data burst can be interleaved among multiple codewords that can be error-corrected/detected (e.g., by performing an ECC operation on the codewords) independently from each other. Alternatively speaking, each one of the subsets (e.g., corresponding to a respective symbol) received from a single memory device can be individually error-corrected/detected as long as the subsets are interleaved among different codewords.

FIG. 1B is a block diagram of an apparatus in the form of a dual in-line memory modules (DIMM) 110 in accordance with a number of embodiments of the present disclosure. The DIMM 110 illustrated in FIG. 1B can be analogous to one or more DIMMs 110-1, ..., 110-X illustrated in FIG. 1A.

The memory devices 105-1, ..., 105-Z (e.g., collectively referred to as memory devices 105) can be volatile and/or non-volatile memory devices. As a non-limiting example, one or more of the memory devices 105 can have DRAM (e.g., DRAM dies) and/or FeRAM (FeRAM dies). Each memory device 105 can include control circuitry 109-1, ..., 109-Z (collectively referred to as control circuitry 109) which can be used to execute commands on the memory devices 105. The control circuitry 109 can receive commands from controller 114. The control circuitry 109 can be configured to execute commands to read and/or write data in the memory devices 105-1, ..., 105-Z.

The memory devices 105 can be N-bit memory devices that are configured to provide N bits of data at a time (e.g., per data burst). In an example embodiment, the memory devices 105 can be 16-bit memory devices configured to provide 16 bits of data per data burst to the controller 114.

In a number of embodiments, data/symbols can be grouped to be read from the memory devices 105 together over multiple data bursts (e.g., beats) as a "memory transfer block" (MTB). The size of the MTB can be determined by the bus width multiplied by the burst length (e.g., quantity of beats). Accordingly, an MTB can include multiple codewords across multiple memory devices as described herein. Often, a size of an MTB may be larger than that of requested data (e.g., data requested from a host, such as the host 102 illustrated in FIG. 1A), which may result in increased latency and/or energy consumption associated with operating the DIMM 110, such as reading and/or performing an ECC operation on the MTB. To mitigate against the increased latency and/or energy consumption incurred from the MTB being unnecessarily larger, constituent data/symbols of the MTB can be partially read from a cache, such as the cache 106. As an example, the cache 106 can have a size of 32 megabytes (MB) for an MTB having a size of 256 bytes (B) or 512 B. Further, because reading from the cache 106 can decreases instances of data/symbols being read from the memory devices 105, undesired incidents (e.g., hammering events) on the memory devices 105 can be reduced, which further provides benefits of maintaining a level of minimum reliability.

In a number of embodiments, one or more of the memory devices 105 can be used to store the ECC data/symbols (e.g., parity data/symbols) corresponding to codewords. As used herein, a memory device of a DIMM that is configured to store ECC data/symbols is referred to as an ECC memory device. Further, as used herein, a memory device of a DIMM that is configured to/used to store non-ECC data/symbols (e.g., user data and/or metadata) is referred to as a non-ECC memory device. In an example embodiment, a DIMM can include 11 memory devices with 8 non-ECC memory devices and 3 ECC memory devices. In another example embodiment, a DIMM can include 20 memory devices with 16 non-ECC memory devices and 4 ECC memory devices.

In various embodiments, each memory device 105 can correspond to a respective channel. For example, a DIMM may include a plurality of ×16 memory devices with each memory device corresponding to a respective 16-bit channel. The memory devices 105 of a DIMM may also be organized as multiple groupings of memory devices, which may be referred to as ranks, with a memory device from each rank being associated with a particular one of multiple channels. As an example, all memory devices of a rank may correspond to a single channel. Embodiments are not limited to a particular quantity of memory devices per DIMM, a particular quantity of ranks, or to a particular quantity of channels.

As described herein, the controller 114 can be configured to use the interleaving component 111 to write encoded codewords to the memory devices 105-1, ..., 105-Z in a manner that portions of data (e.g., symbols) encoded within a same codeword are stored in different memory devices 105-1, ..., 105-Z. When the portions of data stored in different memory devices are read in parallel, therefore, the portions of data are interleaved (e.g., distributed) among a number of different codewords to be reorganized into the encoded codewords. For example, when a DIMM has 11 memory devices (e.g., ×16 devices) including 8 non-ECC memory devices and 3 ECC memory devices, data/symbols received from 11 memory devices can be interleaved among 4 different codewords. If the memory devices are ×16 devices, each of the 4 codewords can each comprise 11 symbols (e.g., 8 4-bit data symbols and 3 4-bit parity symbols).

In a non-limiting example, an example apparatus can include one or more memory devices (e.g., memory devices 105) and a controller (e.g., controller 114). The controller, in this example, can be configured to read data corresponding to a set of multibit symbols from one of the one or more memory devices. The data includes multibit symbols of the set interleaved with other bits of at least one codeword.

As described herein, one or more of the number of memory devices can be a 16-bit memory device configured to provide 16 bits of data at a time (e.g., per data burst) to the controller. In some embodiments, the controller can be configured to correct one or more erroneous symbols of the set when the one or more erroneous symbols corresponds to data received from a single memory device of the number of memory devices and during a same data burst. Further, the controller can be configured to detect one or more erroneous symbols of the set corresponding to data received from more than a single memory device of the number of memory devices during a same data burst.

Continuing with the non-limiting example, at least one of the one or more memory devices can include a DRAM device, FeRAM device, or any combination thereof. In some embodiments, at least one of the one or more memory devices can include metadata or parity symbols.

Continuing with the non-limiting example, the controller can be configured to include the set of multibit symbols within a single codeword. In this example, each symbol within the single codeword can correspond to 8-bit data received over four data bursts. The controller can be further configured to perform an ECC operation on the single codeword to provide an error correction/detection capability of correcting three erroneous symbols within the codeword or detecting four erroneous symbols within the codeword, or both.

FIGS. 2A-2D illustrate examples of interleaving of non-binary codes in accordance with a number of embodiments of the present disclosure. Although not illustrated in FIGS. 2A-2D, codewords illustrated in FIGS. 2A-2D were previously written by the controller 114 to multiple memory devices (e.g., the memory devices 105 illustrated in FIG. 1A) such that the bits corresponding to each codeword are read from multiple memory devices (alternatively from a cache, such as the cache 106 illustrated in FIG. 1A). Alternatively speaking, data being provided from each memory device can be dispersed into multiple subsets (e.g., symbols), which can be interleaved among multiple codewords. Each subset (e.g., subsets 221, 223, and/or 225) within each codeword illustrated in FIGS. 2A-2D can be non-binary symbols that can be one of $2^N$ elements of a finite Galois field, as described herein.

Although embodiments are not so limited, each subset received from 16-bit memory device can be 4-bit corresponding to 4-bit symbol to reduce overhead of codewords and/or avoid increased latencies that may be incurred from increasing a quantity of constituent bits of a symbol.

TABLE 1

| Symbol Size | N codewords size | Non-ECC bits | ECC (Parity) bits/codeword | Overhead |
|---|---|---|---|---|
| 1 bit (total bits 208) | 16 | 8 (8) | 5 (5) | 62% |
| 2 bits (192) | 8 | 16 (8) | 8 (4) | 50% |
| 4 bits (176) | 4 | 32 (8) | 12 (3) | 37.5% |
| 8 bits (176) | 2 | 64 (8) | 24 (3) | 37.5% |
| 16 bits (176) | 1 | 128 (8) | 48 (3) | 37.5% |

For example, Table 1 lists impacts on overhead of each codeword based on a size of its symbol(s). For example, Table 1 indicates that, to provide an error correction/detection capability of SEC-DEC for 128 bits/data burst of non-ECC (e.g., user) symbols received from eight 16-bit memory devices, at least five 1-bit ECC symbols is required for each one of sixteen codewords (each having eight 1-bit non-ECC symbols); at least four 2-bit ECC symbols is required for each one of eight codewords (each having eight 2-bit non-ECC symbols); at least three 4-bit ECC symbols is required for each one of four codewords (each having eight 4-bit non-ECC symbols); at least three 8-bit ECC symbols is required for each one of two codewords (each having eight 8-bit non-ECC symbols); and at least three 16-bit ECC symbols is required for a single codeword having eight 16-bit non-ECC symbols. As illustrated in Table 1, the reduced overhead (a size ratio of ECC symbol(s) to non-ECC symbol(s)) is achieved using 4, 8, and 16-bit symbol(s) (such as 37.5%). Because symbols with a larger size can incur increased latencies associated with operating ×16 DIMM (e.g., encoding/decoding and/or performing an ECC operation), 4-bit symbols can be used to operate ×16 DIMM rather than 8-bit or 16-bit symbol(s).

Figure 2A:
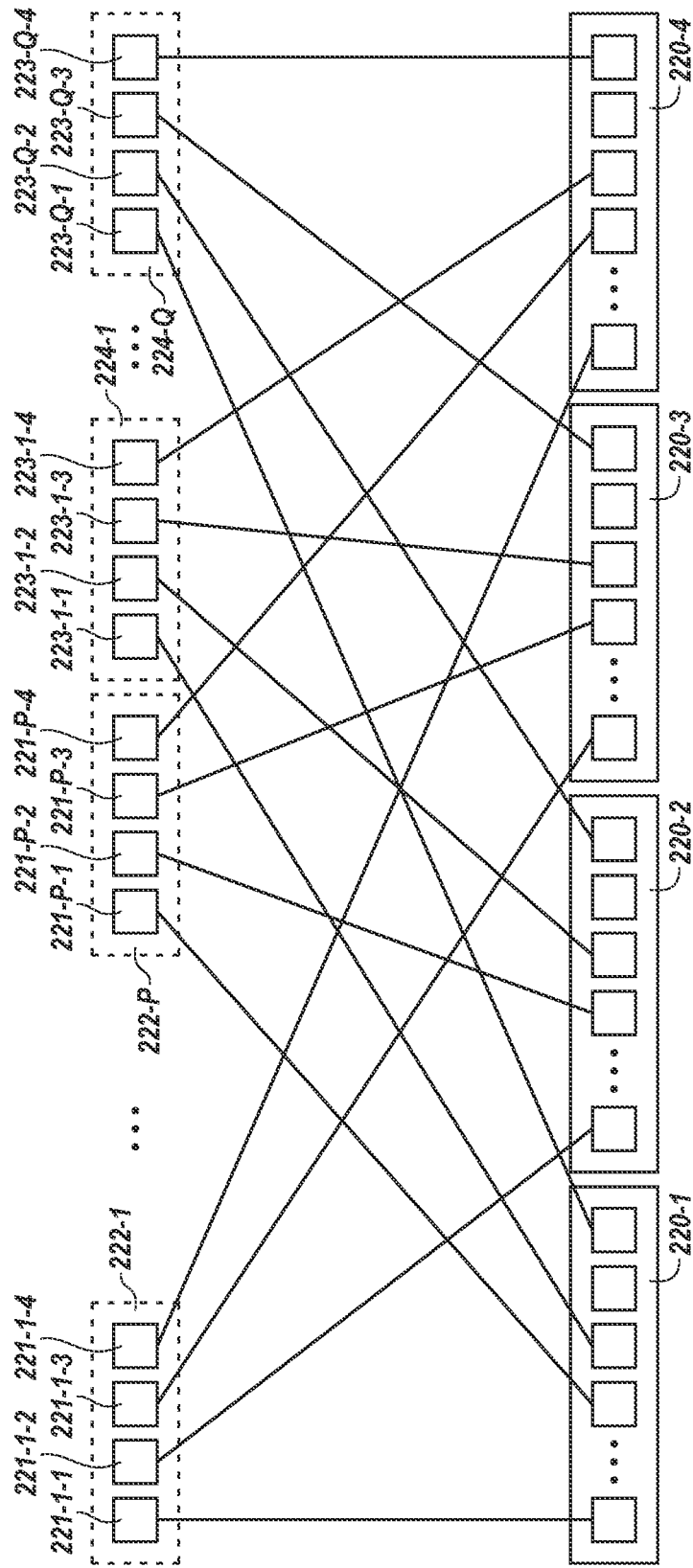

FIG. 2A illustrates an example where subsets of data received from memory devices 222-1, . . . , 222-P (e.g., collectively referred to as memory devices 222) and 224-1, . . . , 224-Q (e.g., collectively referred to as memory devices 224) are interleaved among four different codewords 220-1, 220-2, 220-3, and 220-4 (e.g., collectively referred to as codewords 220). In some embodiments, at least a portion of the subsets of data can also be received from a cache (e.g., the cache 106 illustrated in FIG. 1A) instead of the memory devices 222. As illustrated in FIG. 2A, the codeword 220-1 includes a first subset of data from each one of the memory devices 222 and 224, such as subsets 221-1-1, . . . , 221-P-1, and 223-1-1, . . . , 223-Q-1, the codeword 220-2 includes a second subset of data from each one of the memory devices 222 and 224, such as subsets 221-1-2, . . . , 221-P-2 and 223-1-2, . . . , 223-Q-2, the codeword 220-3 includes a third subset of data from each one of the memory devices 222 and 224, such as subsets 221-1-3, . . . , 221-P-3 and 223-1-3, . . . , 223-Q-3, and the codeword 220-4 includes a fourth subset of data from each one of the memory devices 222 and 224, such as subsets 221-1-4, . . . , 221-P-4 and 223-1-4, . . . , 223-Q-4. Each subset 221 and/or 223 received from a respective memory device can corresponding to a symbol. Although embodiments are not so limited, the subsets 221 can correspond to non-ECC symbols and the subsets 223 can correspond to ECC symbols, such as parity symbols.

As illustrated in FIG. 2A, data from each one of the memory devices 222 and 224 are dispersed into four different subsets (e.g., subsets 221 and 223). In an example where each one of the memory devices 222 and 224 is a 16-bit memory device (such that four 4-bit subsets can be received from each memory device per data burst) and is part of a DIMM having eight non-ECC memory devices (e.g., memory devices 222) and three ECC memory devices (e.g., memory devices 224), interleaving the subsets 221 and 223 among the codewords 220 results in eight 4-bit non-ECC symbols and three ECC 4-bit symbols within each one of the codewords 220. An error correction operation performed using three parity symbols on codewords 220-1, 220-2, 220-3, and 220-4 (each having eleven symbols) can correct a single erroneous symbol and/or detect that there are two erroneous symbols within each codeword 220.

Figure 2B:
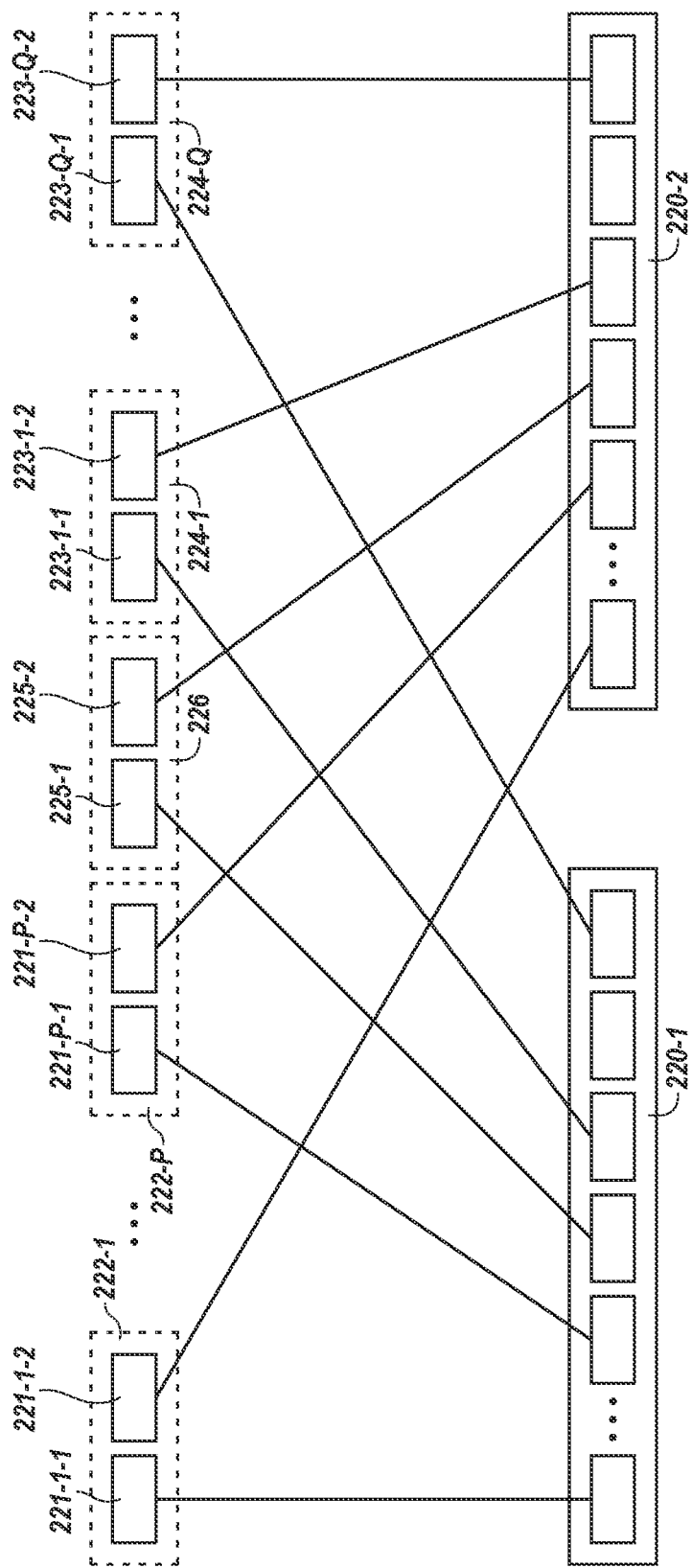

FIG. 2B illustrates an example where subsets of data received from memory devices 222-1, . . . , 222-P (e.g., collectively referred to as memory devices 222), 224-1, . . . , 224-Q (e.g., collectively referred to as sets of symbols 224), and 226 are interleaved among two different codewords 220-1 and 220-2 (collectively referred to as codewords 220). In some embodiments, at least a portion of the subsets of data can also be received from a cache (e.g., the cache 106 illustrated in FIG. 1A) instead of the memory devices 222. As illustrated in FIG. 2B, the codeword 220-1 includes a first subset of data from each one of the memory devices 222, 224, and 226, such as such as subsets 221-1-1, . . . , 221-P-1, 223-1-1, . . . , 223-Q-1, and 226-1 and the codeword 220-2 includes a second subset of data from each one of the memory devices 222, 224, and 226, such as subsets 221-1-2, . . . , 221-P-2, 223-1-2, . . . , 223-Q-2, and 226-2. Although embodiments are not so limited, the subsets 221 can be non-ECC symbols, the subsets 225 can correspond to non-ECC symbols corresponding to metadata, and the subsets 223 can correspond to ECC symbols, such as parity symbols.

As illustrated in FIG. 2B, data from each one of the memory devices 222, 224, 226 are dispersed into two different subsets (e.g., subsets 221, 223, and 225). In an example where each one of the memory devices 222, 224, and 226 is a 16-bit memory device (such that four 8-bit subsets can be received from each memory device per data burst) and is part of a DIMM having seventeen non-ECC memory devices (e.g., memory devices 222 configured to store user data and memory device 226 configured to store metadata) and three ECC memory devices (e.g., memory devices 224), interleaving the subsets 221, 223, and 225 among the codewords 220 results in sixteen 8-bit non-ECC symbols, one 8-bit symbol corresponding to metadata, and three 8-bit ECC symbols within each one of the codewords 220. An error correction operation performed using three parity symbols on codewords 220-1 and 220-2 (each having twenty symbols) can correct a single erroneous symbol and/or detect that there are two erroneous symbols within each codeword 220.

Figure 2C:
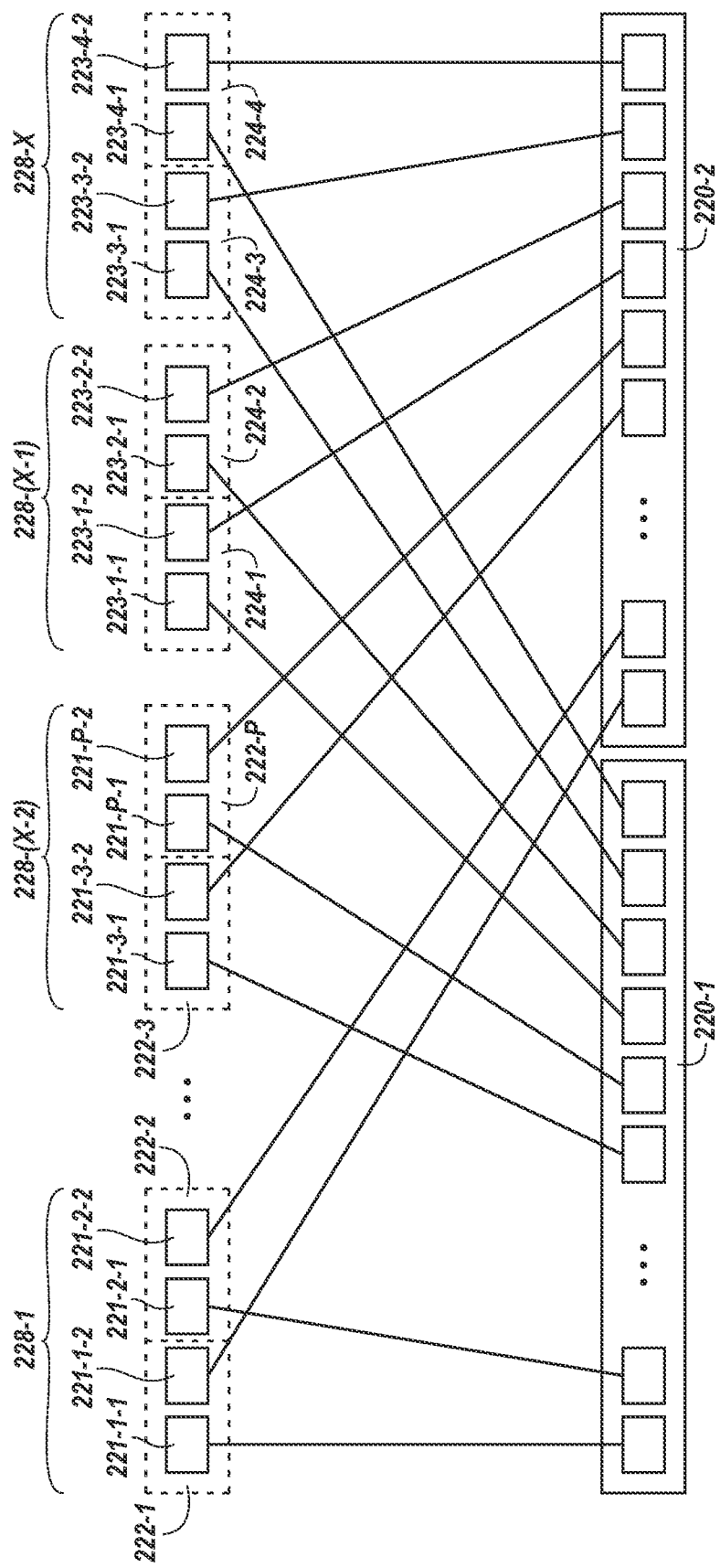

FIG. 2C illustrates an example where subsets of data received from memory devices 222-1, . . . , 222-P (e.g., collectively referred to as sets of symbols 222) and 224-1, . . . , 224-Q (e.g., collectively referred to as sets of symbols 224) are interleaved among two different codewords 220-1 and 220-2 (collectively referred to as codewords 220). In some embodiments, at least a portion of the subsets of data can also be received from a cache (e.g., the cache 106 illustrated in FIG. 1A) instead of the memory devices 222. As illustrated in FIG. 2A, the codeword 220-1 includes a first subset of data from each one of the memory devices 222 and 224, such as subsets 221-1-1, . . . , 221-P-1, and 223-1-1, . . . , 223-4-1 and the codeword 220-2 includes a second subset of data from each one of the memory devices 222 and 224, such as subsets 221-1-2, . . . , 221-P-2 and 223-1-2, . . . , 223-4-2. Each subset 221 and/or 223 received from a respective memory device can be a symbol. Although embodiments are not so limited, the subsets 221 can correspond to non-ECC symbols and the subsets 223 can correspond to ECC symbols, such as parity symbols.

FIG. 2C further illustrates an example where different (e.g., two) memory devices are grouped as one channel. As an example, as illustrated in FIG. 2C, the memory devices 222-1 and 222-2 are grouped as a channel 228-1; the memory devices 222-(P-1) and 222-P are grouped as a channel 228-(X-2); the memory devices 224-1 and 224-2 are grouped as a channel 228-(X-1); and the memory devices 224-3 and 224-4 are grouped as a channel 228-X. Therefore, each codeword 220 illustrated in FIG. 2B includes two subsets from each channel 228. Although embodiments are not so limited, the subsets 221 can be non-ECC symbols and the subsets 223 can be ECC symbols, such as parity symbols.

As illustrated in FIG. 2C, data from each one of the memory devices 222 and 224 are dispersed into two different subsets (e.g., subsets 221 and 223). In an example where each one of the memory devices 222 and 224 is a 8-bit memory device (such that two 4-bit subsets can be received from each memory device per data burst) and is part of a DIMM having sixteen non-ECC memory devices (e.g., memory devices 222 and/or eight channels 228) and four ECC memory devices (e.g., memory devices 224 and/or two channels 228), interleaving the subsets 221 and 223 among the codewords 220 results in sixteen 4-bit non-ECC symbols and four ECC 4-bit symbols within each one of the codewords 220. An error correction operation performed using three parity symbols on codewords 220-1 and 220-2 (each having twenty symbols) can correct a single erroneous symbol and/or detect that there are two erroneous symbols within each codeword 220.

FIG. 2D illustrates an example where data (e.g., subsets) received from memory devices 222-1, . . . , 222-P (e.g., collectively referred to as memory devices 222), 224-1, . . . , 224-3 (e.g., collectively referred to as memory devices 224), and 226 contribute to a codeword 220. In some embodiments, at least a portion of the data can be also received from a cache (e.g., the cache 106 illustrated in FIG. 1A) instead of the memory devices 222, 224, and 226. As illustrated in FIG. 2D, data (e.g., subsets 221 and 223) received from each memory device/cache can correspond to a respective symbol within the codeword 220 of FIG. 2D. Although embodiments are not so limited, the subsets 221 can correspond to non-ECC symbols, the subset 225 can correspond to non-ECC symbol corresponding to metadata, and the subsets 223 can correspond to ECC symbols, such as parity symbols.

In an example embodiment illustrated in FIG. 2D, two memory devices are grouped as one channel. As an example, as illustrated in FIG. 2D, memory devices 222-1 and 222-2 are grouped as a channel 228-1; two memory devices 222-(P-1) and 222-P are grouped as a channel 228-(X-2); two memory devices a 226 and 224-1 are grouped as a channel 228-(X-1); and two memory devices 224-2 and 224-3 are grouped as a channel 228-X. Embodiments are not limited to a particular quantity of memory devices each channel can include.

As illustrated in FIG. 2C, data from each one of the memory devices 222 and 224 (e.g., subsets 221, 223, and 225) can correspond to a respective symbol. In an example where each one of the memory devices 222, 224, and 226 is a 8-bit memory device (such that on 8-bit subset can be received from each memory device per data burst) and is part of a DIMM having seventeen non-ECC memory devices (e.g., memory devices 222 configured to store user data (e.g., eight channels 228) and memory device 226 configured to store metadata) and three ECC memory devices (e.g., memory devices 224 and/or two channels 228), interleaving the subsets 221, 223, and 225 among the codewords 220 results in sixteen 4-bit non-ECC symbols and four ECC 4-bit symbols within each one of the codewords 220. An error correction operation performed using three parity symbols on the codeword 220 of FIG. 2D can correct a single erroneous symbol and/or detect that there are two erroneous symbols within the codeword 220.

Figure 3A:
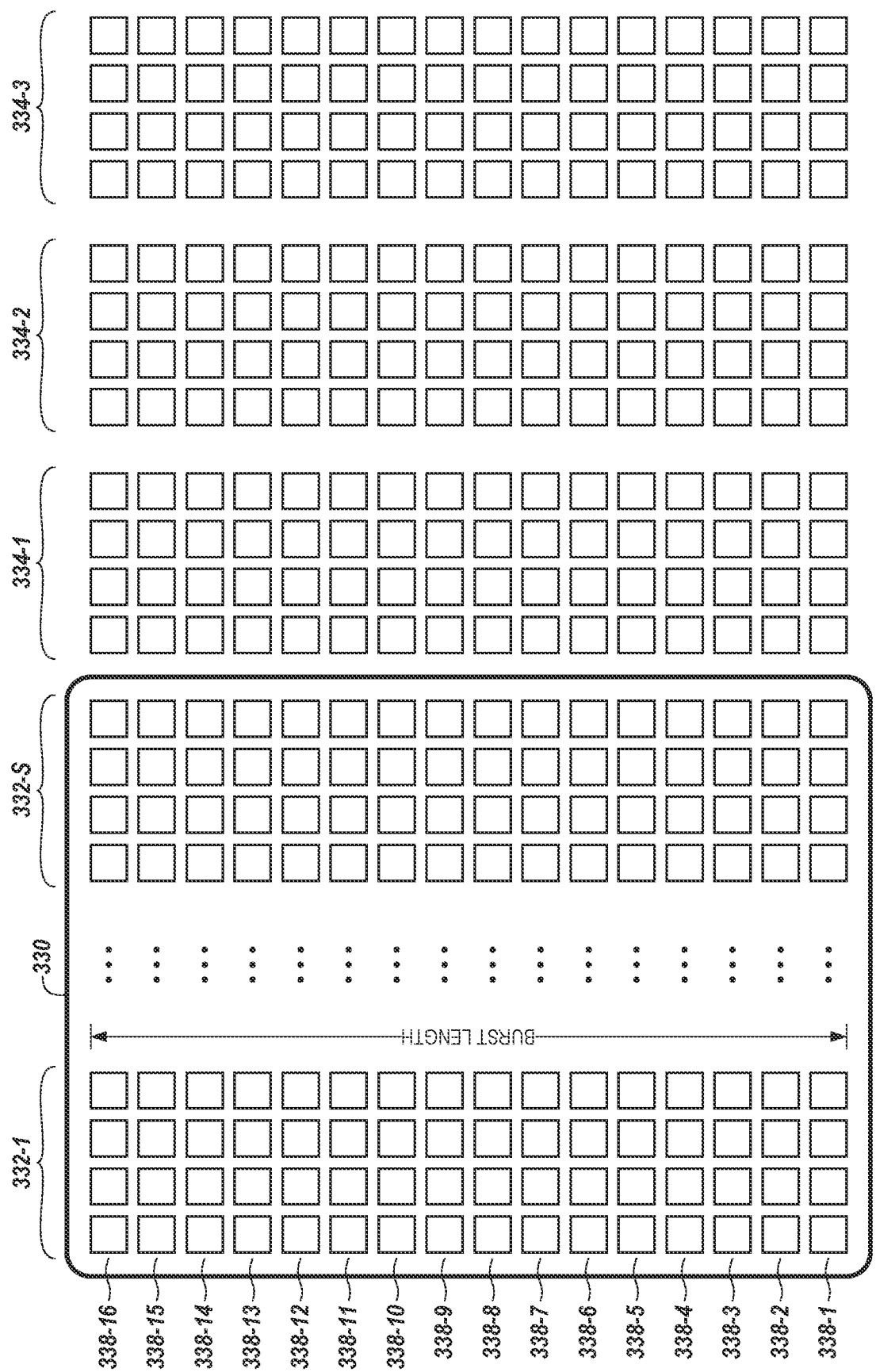

FIGS. 3A-3B illustrates a memory transfer block (MTB) 330 with subsets of data received from a number of memory devices/cache in accordance with a number of embodiments of the present disclosure. As described herein, an MTB refers to data that are read together over a particular (e.g., predefined) number of data bursts.

Each group 332, 334, and 346 illustrated in FIGS. 3A-3B represents a group of subsets (of data) received from a respective memory device (e.g., one of the memory devices 105 illustrated in FIG. 1B). For example, a group of subsets 332-1 can be received from a single memory device, while a group of subsets 332-S can be received from a different memory device. Each subset (e.g., corresponding to a single rectangular within each group) can correspond to a symbol within a codeword, which can be non-binary N-bit symbol(s) that can be one of $2^N$ elements of a finite Galois field, as described herein. In some examples, at least a portion of the groups of subsets can be also received from a cache (e.g., the cache 106 illustrated in FIG. 1A), as described herein. A single row of each group of subsets 332, 334, and 336 can represent data received over a same data burst (e.g., one of data bursts 338-1, . . . , 338-16).

Figure 4:
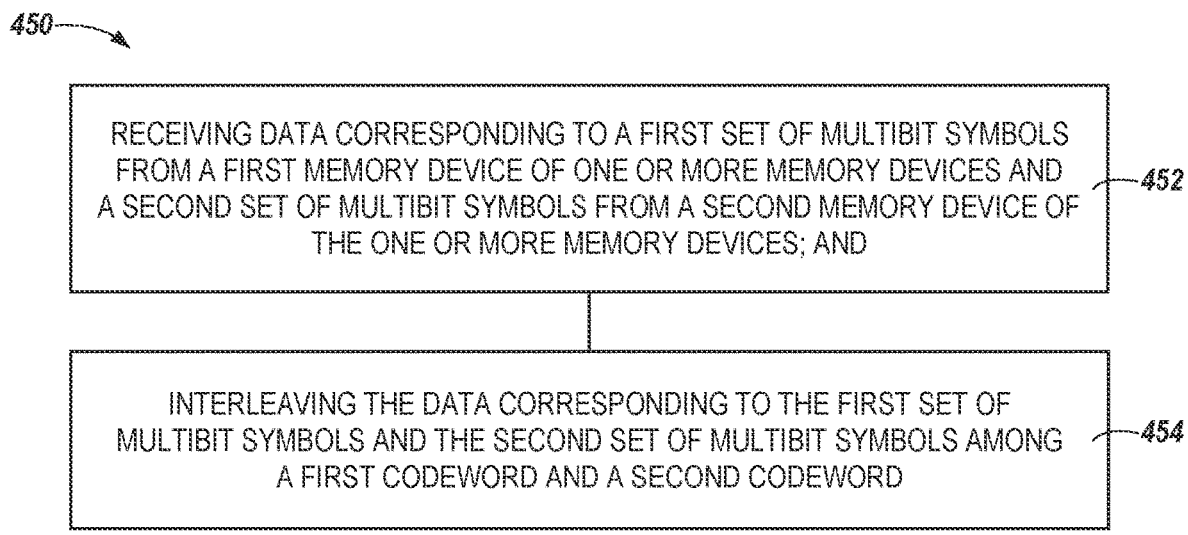
FIG. 4 illustrates an example method for performing an error correction code (ECC) operation on symbols interleaved among a number of codewords in accordance with a number of embodiments of the present disclosure.

Each subset of the groups of subsets 332-1, . . . , 332-S illustrated in FIG. 3A corresponds to a non-ECC symbol, while each subset of the groups of subsets 334-1, . . . , 334-3 illustrated in FIG. 3A corresponds to an ECC symbol, such as a parity symbol. As illustrated in FIG. 3A, 4 subsets are received from each memory device (e.g., and/or a cache) per data burst and the MTB 330 of FIG. 3A is defined over 16 data bursts 338-1, . . . , 338-16. In an example where the groups of subsets 332-1, . . . , 332-S and 334-1, . . . , 334-3 are from a DIMM including 8 non-ECC memory devices with each being a 16-bit memory devices that provides four 4-bit subsets per data burst, a size of the MTB 330 can be 256 bytes (2 bytes*8 memory devices*16 data bursts).

Subsets of the groups 332 and 334 can be interleaved among multiple codewords. For example, 4 subsets provided from each memory device per each data burst can be interleaved among 4 different codewords. In this instance, 4 subsets from each memory devices and/or 4 codewords among which 4 subsets are interleaved can be error-corrected/detected independently from each other. An error correction capability provided for each one of the codewords can correct one or more errors within a single device per each data burst. For example, one or more errors within the group of subsets 332-S over data bursts 338-1 to 338-16 can be corrected (using parity symbols corresponding to the groups of subsets 334-1, 334-2, and 334-3). Further, one or more errors within multiple groups of subsets can be corrected as long as there exists one or more errors within no more than a single memory device per each data burst. For example, one or more errors within the groups of subsets 332-S and 332-1 can be corrected when the one or more errors of the groups are present respectively in different data bursts (e.g., errors within the group 332-S received over data bursts 338-1 to 338-8 and errors within the group 332-1 received over data bursts 338-9 to 338-16). For example, one or more errors within the groups of subsets 332-S, 334-2, 332-1, and 334-1 can be corrected when the one or more errors of the groups are present respectively in different data bursts (e.g., errors within the group 332-S received over data bursts 338-1 to 338-4, errors within the group 334-2 received over data bursts 338-5 to 338-8, errors within the group 332-1 received over data bursts 338-9 to 338-12, and errors within the group 334-1 received over data bursts 338-13 to 338-16).

Further, an error detection capability provided for the codewords can detect one or more errors of multiple (e.g., two) memory devices per each data burst. For example, in response to the groups of subsets 332-1 and 332-S having one or more errors over the same data bursts (e.g., data bursts 338-1, . . . , 338-16), a notification can be provided (e.g., to the host 102 illustrated in FIG. 1A) that more than a single memory device has failed over same data bursts.

Turning to FIG. 3B, each subset illustrated in FIG. 3B is received over multiple data bursts, such as four data bursts. Accordingly, as illustrated in FIG. 3B, each subset of a first row (e.g., corresponding to data bursts 348-1 to 348-4) is received over data bursts 348-1 to 348-4, each subset of a second row (e.g., corresponding to data bursts 348-5 to 348-8) is received over data bursts 348-5 to 348-8, each subset of a third row (e.g., corresponding to data bursts 348-9 to 348-12) is received over data bursts 348-9 to 348-12, and each subset of a fourth row (e.g., corresponding to data bursts 348-13 to 348-16) is received over data bursts 348-13 to 348-16.

Each subset of the groups 342-1, . . . , 342-S illustrated in FIG. 3B corresponds to a non-ECC symbol and each subset of the group 344 can be ECC symbols. In an example embodiment, each subset of the groups 342, 344, and 346 can be received over 4 data bursts via two data buses (e.g., 2 DQs). In this example, therefore, each subset can be 8-bit symbol (2 bits per data burst*4 data bursts), which results in a MTB 340 with a predetermined burst length of 16 data bursts being 256 bits (e.g., 64 bits per data burst*16 data bursts). In an example, where subsets of the group 346 correspond to ECC symbols, including subsets of the groups 342, 344, and 346 within a single codeword can provide an error correction/detection capability of correcting up to three erroneous symbols (e.g., three subsets) and/or detecting up to four erroneous symbols (e.g., four subsets). In an example where subsets of the group 346 correspond to metadata (non-ECC symbols), an ECC operation performed on the codeword can correct three erroneous symbols (e.g., three subsets) without having a capability to detect four erroneous symbols (e.g., four subsets).

In a non-limiting example, an example system can include one or more N-bit memory devices with each being configured to provide one or more multibit symbols totaling N bits per data burst and a controller coupled to the one or more N-bit memory devices. In this example, the controller can be configured to receive, at least in part from the one or more N-bit memory devices, subsets of data corresponding to a set of multibit symbols including a first multibit symbol and a second multibit symbol received from one of the one or more N-bit memory devices. The controller can be further configured to interleave the subsets corresponding to the set of multibit symbols among a set of codewords to perform, with an error correction capability of correcting a single erroneous multibit symbol or detecting two erroneous multibit symbols within a respective one of the set of codewords, an ECC operation. The ECC operation can be performed on the first multibit symbol of the set of multibit symbols of a first codeword of the set of codewords and the second multibit symbol of the set of multibit symbols of a second codeword of the set of codewords. The ECC operation performed on the set of codewords can provide an error correction capability of correcting a single erroneous multibit symbol or detecting two erroneous multibit symbols within each one of the set of codewords.

Continuing with the non-limiting example, one or more of the one or more N-bit memory devices can be configured to operate according to a double data rate 5 (DDR5) JEDEC standard protocol. Further, the one or more N-bit memory devices can correspond to 16-bit memory devices configured to provide one or more multibit symbols totaling 16 bits per data burst.

Continuing with the non-limiting example, the set of multibit symbols can be a first set of multibit symbols received during a first data burst and the controller can be configured to receive a second set of multibit symbols during a second data burst. In this example, the controller can be further configured to interleave the subsets corresponding to the second set of multibit symbols among a second set of codewords to provide an error correction capability of the first set of codewords and the second set of codewords independently from each other.

Continuing with the non-limiting example, the controller can be configured to receive subsets of data corresponding to a plurality of sets of multibit symbols over multiple data bursts. The controller can be further configured to interleave the subsets corresponding to the plurality of sets of multibit symbols within a single codeword to perform an ECC operation on the plurality of sets of multibit symbols as a unit.

Continuing with the non-limiting example, the controller further includes a cache. In this example, the controller can be configured to receive data corresponding to a first portion of the set of multibit symbols at least partially from the one or more memory devices and retrieve data corresponding to a second portion of the set of multibit symbols from the cache.

FIG. 4 illustrates an example method 450 for performing an error correction code (ECC) operation symbols interleaved among a set of codewords in accordance with a set of embodiments of the present disclosure. At 452, the method 450 includes receiving data corresponding to a first set of multibit (e.g., non-binary) symbols from a first memory device of one or more memory devices (e.g., the memory devices 105 illustrated in FIG. 1B) and a second set of multibit symbols from a second memory device of the one or more memory devices.

At 454, the method 450 includes interleaving the data corresponding to the first set of multibit symbols and the second set of multibit symbols among a first codeword and a second codeword. In response to the data corresponding to the first set and the second set of multibit symbols being interleaved, a first codeword includes a first symbol of the first set and a first symbol of the second set of multibit symbols and a second codeword includes a second symbol of the first set and a second symbol of the second set of multibit symbols. In some embodiments, data corresponding to different sets of multibit symbols can be received from the set of memory devices over multiple data bursts and the data corresponding to the different sets of multibit symbols can be interleaved within a single codeword.

In some embodiments, the method 450 can further include performing, to provide an error correction/detection capability to the first set of symbols and the second set of symbols independently from each other, an error correction code (ECC) operation on the first codeword and the second codeword. The ECC operation can be performed (on the first codeword and the second codeword) by correcting, within a respective one of the first codeword and the second codeword, one or more erroneous symbols corresponding to one of the set of memory devices. Alternatively, the ECC operation can be further performed by detecting, within a respective one of the first codeword and the second codeword, one or more erroneous symbols corresponding to two memory devices of the set of memory devices. Further in this example, the second set of multibit symbols can be parity symbols and, in this example, the ECC operation can be performed on the first codeword using the first symbol of the second set and the second symbol of the second set.

As used herein, "a number of" something can refer to one or more of such things. For example, a number of memory devices can refer to one or more memory devices. A "plurality" of something intends two or more. Additionally, designators such as "N," as used herein, particularly with respect to reference numerals in the drawings, indicates that a number of the particular feature so designated can be included with a number of embodiments of the present disclosure.

The figures herein follow a numbering convention in which the first digit or digits correspond to the drawing figure number and the remaining digits identify an element or component in the drawing. Similar elements or components between different figures may be identified by the use of similar digits. As will be appreciated, elements shown in the various embodiments herein can be added, exchanged, and/or eliminated so as to provide a number of additional embodiments of the present disclosure. In addition, the proportion and the relative scale of the elements provided in the figures are intended to illustrate various embodiments of the present disclosure and are not to be used in a limiting sense.

Although specific embodiments have been illustrated and described herein, those of ordinary skill in the art will appreciate that an arrangement calculated to achieve the same results can be substituted for the specific embodiments shown. This disclosure is intended to cover adaptations or variations of various embodiments of the present disclosure. It is to be understood that the above description has been made in an illustrative fashion, and not a restrictive one. Combinations of the above embodiments, and other embodiments not specifically described herein will be apparent to those of skill in the art upon reviewing the above description. The scope of the various embodiments of the present disclosure includes other applications in which the above structures and methods are used. Therefore, the scope of various embodiments of the present disclosure should be determined with reference to the appended claims, along with the full range of equivalents to which such claims are entitled.

In the foregoing Detailed Description, various features are grouped together in a single embodiment for the purpose of streamlining the disclosure. This method of disclosure is not to be interpreted as reflecting an intention that the disclosed embodiments of the present disclosure have to use more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separate embodiment.

What is claimed is:

1. An apparatus, comprising:
 a plurality of memory devices; and
 a controller coupled to the plurality of memory devices via a plurality of respective channels, the controller configured to:
  read, from the plurality of memory devices and during one or more data bursts, a number of codewords each comprising a number of multibit user data symbols respectively corresponding to different memory devices of the plurality of memory devices; and
  correct an error of one or more multibit symbols of at least one codeword of the number codewords and corresponding to one or more memory devices of the plurality of memory devices.

2. The apparatus of claim 1, wherein each codeword further comprises one or more error correction code (ECC) symbols, and wherein the controller is configured to correct the error of the one or more multibit symbols using the one or more ECC symbols of a respective codeword of the number of codewords.

3. The apparatus of claim 2, wherein the controller is configured to detect an amount of errors of the one or more multibit symbols using the one or more ECC symbols of the respective codeword of the number of codewords.

4. The apparatus of claim 1, wherein the controller is configured to read the number of codewords over multiple data bursts.

5. The apparatus of claim 1, wherein at least one memory device of the plurality of memory devices is an N-bit memory device configured to provide N bits of data at a time.

6. The apparatus of claim 1, wherein at least one of the plurality of memory devices is configured to operate according to a double data rate 5 (DDR5) JEDEC standard protocol.

7. An apparatus, comprising:
 a plurality of memory devices; and
 a controller coupled to the plurality of memory devices via a plurality of respective channels, the controller configured to:
  receive a read command to access at least a portion of a memory transfer block from the plurality of memory devices;
  read, in response to the read command and from each memory device of at least a portion of the plurality of memory devices, a respective set of user data symbols corresponding to different codewords over one or more data bursts; and
  correct an error of a user data symbol of at least one codeword of the codewords read from the plurality of memory devices.

8. The apparatus of claim 7, wherein the controller is further configured to read, in response to the read command and from each memory device of a different portion of the plurality of memory devices, a set of error correction code (ECC) symbols, wherein ECC symbols of the set correspond to different codewords over the one or more data bursts.

9. The apparatus of claim 8, wherein the controller is configured to correct the error of the user data symbol of the at least one codeword of the codewords using a respective ECC symbol of the set of ECC symbols.

10. The apparatus of claim 8 wherein the controller is configured to detect an amount of errors in the at least one codeword using the respective ECC symbol of the set of ECC symbols.

11. The apparatus of claim 7, at least one memory device of the plurality of memory devices comprises a dynamic random access memory (DRAM) device, ferroelectric random access memory (FeRAM) device, or any combination thereof.

12. The apparatus of claim 7, wherein the apparatus corresponds to a dual inline memory module (DIMM).

13. An apparatus, comprising:
 a plurality of memory devices; and
 a controller coupled to the plurality of memory devices via a plurality of respective channels, the controller configured to:
  generate, in response to receipt of a write command to write user data to at least a portion of the plurality of memory devices, a codeword comprising a plurality of user data symbols corresponding to the user data and one or more error correction code (ECC) symbols, wherein at least one of the plurality of user data symbols and the one or more ECC symbols corresponds to a non-binary symbol; and
  write the plurality of user data symbols to at least two memory devices of the plurality of memory devices.

14. The apparatus of claim 13, wherein the controller is configured to generate the one or more ECC symbols based on the user data received as part of the write command.

15. The apparatus of claim 13, wherein the at least one of the plurality of user data symbols and the one or more ECC symbols is an N-bit non-binary symbol with each bit of N bits being an element of a finite Galois field.

16. The apparatus of claim 13, wherein the controller is configured to write symbols of the plurality of user data symbols and the one or more ECC symbols to different memory devices of the plurality of memory devices.

17. The apparatus of claim 13, wherein the controller is configured to access the plurality of memory device simultaneously via the plurality of respective channels.

18. The apparatus of claim 13, wherein the controller is configured to write the plurality of user data symbols to a first portion of the plurality of memory devices and the one or more ECC symbols to a second portion of the plurality of memory devices.

19. The apparatus of claim 13, wherein the ECC symbols corresponds to parity symbols.

* * * * *